US006324231B1

United States Patent
Huang

(10) Patent No.: US 6,324,231 B1
(45) Date of Patent: Nov. 27, 2001

(54) DC OFFSET CANCELLATION APPARATUS AND METHOD FOR DIGITAL DEMODULATATION

(75) Inventor: Ke-Chiang Huang, Hsinchu (TW)

(73) Assignee: Industrial Technology Research Institute (TW)

( * ) Notice: Subject to any disclaimer, the term of this patent is extended or adjusted under 35 U.S.C. 154(b) by 0 days.

(21) Appl. No.: 09/195,243

(22) Filed: Nov. 18, 1998

(30) Foreign Application Priority Data

Aug. 28, 1998 (TW) ................................. 87114281

(51) Int. Cl.[7] .............................. H03D 1/06; H03D 7/14
(52) U.S. Cl. ............................. 375/346; 375/243
(58) Field of Search ................. 455/234.1, 323; 375/346, 243, 254

(56) References Cited

U.S. PATENT DOCUMENTS

| 5,281,968 | 1/1994 | Iwanaga . | |
|---|---|---|---|
| 5,508,656 | 4/1996 | Jaffard et al. . | |
| 5,617,060 | 4/1997 | Wilson et al. . | |
| 5,699,011 | 12/1997 | Sgrignoli . | |
| 5,999,347 | * 12/1999 | Ichimura et al. | 360/32 |
| 6,160,859 | * 12/2000 | Martin et al. | 375/345 |
| 6,175,728 | * 1/2001 | Mitama | 455/323 |

OTHER PUBLICATIONS

Ian Galton, Nov. 1993, IEEE Transaction on Information Theory, vol. 39, No. 6, pp. 1944–1956.*

Yiqun P. Xie, Stephen R. Whiteley, and Theodore Van Duzer, Jun. 1999, IEEE Transactions on Applied Superconductivity, vol. 9, No. 2, pp. 3632–3635.*

Mats Hovin, Alf Olsen, Tor Sverre Landle, and Chris Toumazou, Jan. 1997, IEEE of Solid–State Circuits, vol. 32, No. 1, pp. 13–22.*

* cited by examiner

Primary Examiner—Don N. Vo
Assistant Examiner—Dong X. Nguyen
(74) Attorney, Agent, or Firm—Finnegan, Henderson, Farabow, Garrett & Dunner L.L.P.

(57) ABSTRACT

A DC offset cancellation circuit comprises a subtracter, a noise shaper, an accumulator and an attenuator. The subtracter is used to subtract a quantized DC offset from a digital signal. The noise shaper converts an unquantized DC offset into the quantized DC offset, the quantized DC offset having fewer bits than the unquantized DC offset and an average value in the time domain that is approximately equal to the unquantized DC offset. The accumulator generates an accumulation value by means of summing the outputs of the subtracter. The attenuator is employed to multiply the accumulation value by a constant, which is less than one, and transmit the resulting initial DC offset to the subtracter.

14 Claims, 3 Drawing Sheets

DC OFFSET CANCELLATION APPARATUS AND METHOD FOR DIGITAL DEMODULATATION

BACKGROUND OF THE INVENTION

1. Field of the Invention

The present invention relates to digital signal processing and, more particularly, to methods and apparatus that utilize noise shaping technology for DC offset cancellation prior to digital demodulation.

2. Description of the Related Art

Referring to FIG. 1, a block diagram of a satellite QPSK (Quadrature Phase Shift Keying) receiver is schematically illustrated. In FIG. 1, an antenna 1 is provided to detect a radio frequency (RF) signal, typically in Ku band, which is then converted by a LNB low-noise block (not shown in the drawing) into an intermediate frequency signal IF_1, generally ranging from about 950 MHz to about 1450 MHz in frequency. A tuner 2 receives the signal IF_1 and transmits another intermediate frequency signal IF_2, typically at about 479.5 MHz, to scalars 3 and 4. A local oscillator 5 transmits a local oscillating signal (LO) to scalars 3 and 4. As shown, the local oscillating signal LO transmitted to scalar 4 is shifted by 90 degrees in phase from the local oscillating signal LO transmitted to scalar 3. The scalars 3 and 4 mix the signal IF_2 with the respective local oscillating signal LO, thus generating analog in-phase signal $I_A$ and analog quadrature phase signal $Q_A$, respectively.

An analog-to-digital converter (ADC) 7 is utilized to digitize the analog in-phase signal $I_A$, thus providing a digital in-phase signal $I_D$, while an ADC 8 digitizes the analog quadrature phase signal $Q_A$ to provide a digital quadrature phase signal $Q_D$. Both the digital in-phase signal $I_D$ and the digital quadrature phase signal $Q_D$ are transmitted to a digital demodulator 10 for further processing. Preferably, ADCs 7 and 8 have 6-bit resolution. Moreover, a clock generator 9 generates a fixed-frequency clock signal CLK, preferably with a frequency greater than 60 MHz, for driving ADCs 7 and 8.

Since DC offset in a QPSK signal can result in problems during demodulation, it is preferable to eliminate any DC offset prior to the signal entering digital demodulator 10. Circuits for DC offset cancellation can be categorized into three types: analog, semi-analog, and digital.

The analog type circuit for DC offset cancellation is employed to eliminate DC offset from analog signals. When applied to a satellite QPSK receiver, as shown in FIG. 1, analog type circuits should be arranged between scalars 3 and 4 and the associated ADC 7 or 8, in order to process $I_A$ and $Q_A$, respectively. U.S. Pat. No. 5,508,656 discloses an example of an analog type circuit for DC offset cancellation. This patent utilizes a switching-capacitor technique for DC offset cancellation.

U.S. Pat. Nos. 5,617,060 and 5,699,011 disclose examples of a semi-analog type circuit for DC offset cancellation. When applied to a satellite QPSK receiver, such as depicted in FIG. 1, semi-analog type circuits are used to process both the I and Q channel, and are arranged in feedback loops from $I_D$ to $I_A$ and from $Q_D$ to $Q_A$, respectively. In these systems, the respective digital signal, $I_D$ or $Q_D$, is processed to acquire its digital DC offset, after which a digital-to-analog converter (DAC) converts the digital DC offset to analog, and feeds the analog DC offset back for subtraction from the respective analog signal, $I_A$ or $Q_A$.

A digital type circuit for DC offset cancellation is disclosed in U.S. Pat. No. 5,281,968, and is employed to cancel DC offsets from digital signals. When applied to a satellite QPSK receiver, such as depicted in FIG. 1, a digital type circuit should be arranged between both ADC 7 and digital demodulator 10 and ADC 8 and digital demodulator 10. These circuits are used to process $I_D$ and $Q_D$, respectively, to eliminate any DC offset contained therein.

FIG. 2 provides a block diagram of a conventional digital type circuit for DC offset cancellation. The circuit comprises a subtracter 20, an attenuator 21 and an accumulator 22. As shown in FIG. 2, subtracter 20 receives the respective digital signal, $I_D$ or $Q_D$, which is designated by digital signal x, from the associated ADC 7 or ADC 8, and subtracts a signal Vdc, representing the DC offset, from signal x, thus generating output signal y. Signal y is then fed back to accumulator 22 to generate accumulation value z, which is sent to attenuator 21. In FIG. 2, accumulator 22 consists of a delay 23, which is expressed in the form of a Z-transform, and an adder 24. In accumulator 22, the output of adder 24 is registered and delayed for a sampling period by delay 23, after which it is fed back to adder 24, which adds it to current signal y. Attenuator 21 is used to multiply the accumulation value z by a constant k, which is typically a very small negative power of two such as $2^{-16}$, to generate DC offset signal Vdc. DC offset signal Vdc is then subtracted from digital signal x in subtracter 20 to generate output signal y. Output signal y is then transmitted to digital demodulator 10 for further processing. Thus, any DC offset is canceled from $I_D$ or $Q_D$, respectively, before being sent to digital demodulator 10.

Disadvantageously, application of the circuit of FIG. 2 to a satellite QPSK receiver gives rise to an enormous increase in the required word length for QPSK signals. For ease and clarity, assume that ADC 7 and ADC 8 are provided with 6-bit resolution and their outputs are in 2's-complement form. This six-bit format can be used to express an integer ranging from −32 to 31 in decimal notation with the least significant bit representing one. To practically cancel DC offset signal Vdc, signal y should be represented by a large number of fraction bits in addition to the integer bits. For example:

$$\begin{array}{r} x \quad xxxxxx. \\ -Vdc \quad xx.\ xxxxxxxxx... \\ \hline y \quad xxxxxx.\ xxxxxxxxx... \end{array}$$

In other words, the conventional circuit of FIG. 2 requires the corrected digital in-phase signal $I_D$ and the corrected digital quadrature phase signal $Q_D$ to have a very large word length. In general, the larger the over sampling rate, the ratio of the ADC sample rate to the QPSK symbol rate, the larger the required word length. In the application of single channel per carrier (SCPC), the over sampling rate is quite large and very large word length is needed. Thus, these greater word lengths expand the hardware complexity of the arithmetic circuits of demodulator 10 operating on the QPSK signals. Furthermore, because the frequency of the clock signal CLK is usually greater than 60 MHz, the demodulator may not have sufficient time to process the QPSK signals with greater word length.

SUMMARY OF THE INVENTION

It is therefore an object of the present invention to provide a digital type circuit for DC offset cancellation that uses a reduced word length for corrected QPSK signals.

It is another object of the present invention to provide a circuit and method for DC offset cancellation to reduce the operational burden on the digital demodulator, and thus decrease hardware complexity. A DC offset cancellation circuit consistent with this invention comprises a subtracter for subtracting a quantized DC offset from a digital signal, a noise shaper for converting an unquantized DC offset into the quantized DC offset, the quantized DC offset having fewer bits than the unquantized DC offset and an average value in the time domain approximates the unquantized DC offset, an accumulator for outputting an accumulation value of the outputs of the subtracter, and an attenuator for multiplying the accumulation value by a constant to generate the unquantized DC offset and transmitting the unquantized DC offset to the noise shaper, wherein the constant is less than one.

A method of DC offset cancellation consistent with this invention comprises subtracting a quantized DC offset from a digital signal by using a subtracter, accumulating an output of the subtracter to form an accumulation value, multiplying the accumulation value by a constant to generate an unquantized DC offset, converting the unquantized DC offset to said quantized DC offset whose average value in the time domain approximates said unquantized DC offset and has fewer bits than said unquantized DC offset.

BRIEF DESCRIPTION OF DRAWINGS

The following detailed description, given by way of example, is not intended to limit the invention to the embodiments described herein, and will best be understood in conjunction with the accompanying drawings, in which.

DETAILED DESCRIPTION OF THE INVENTION

Figure 1:
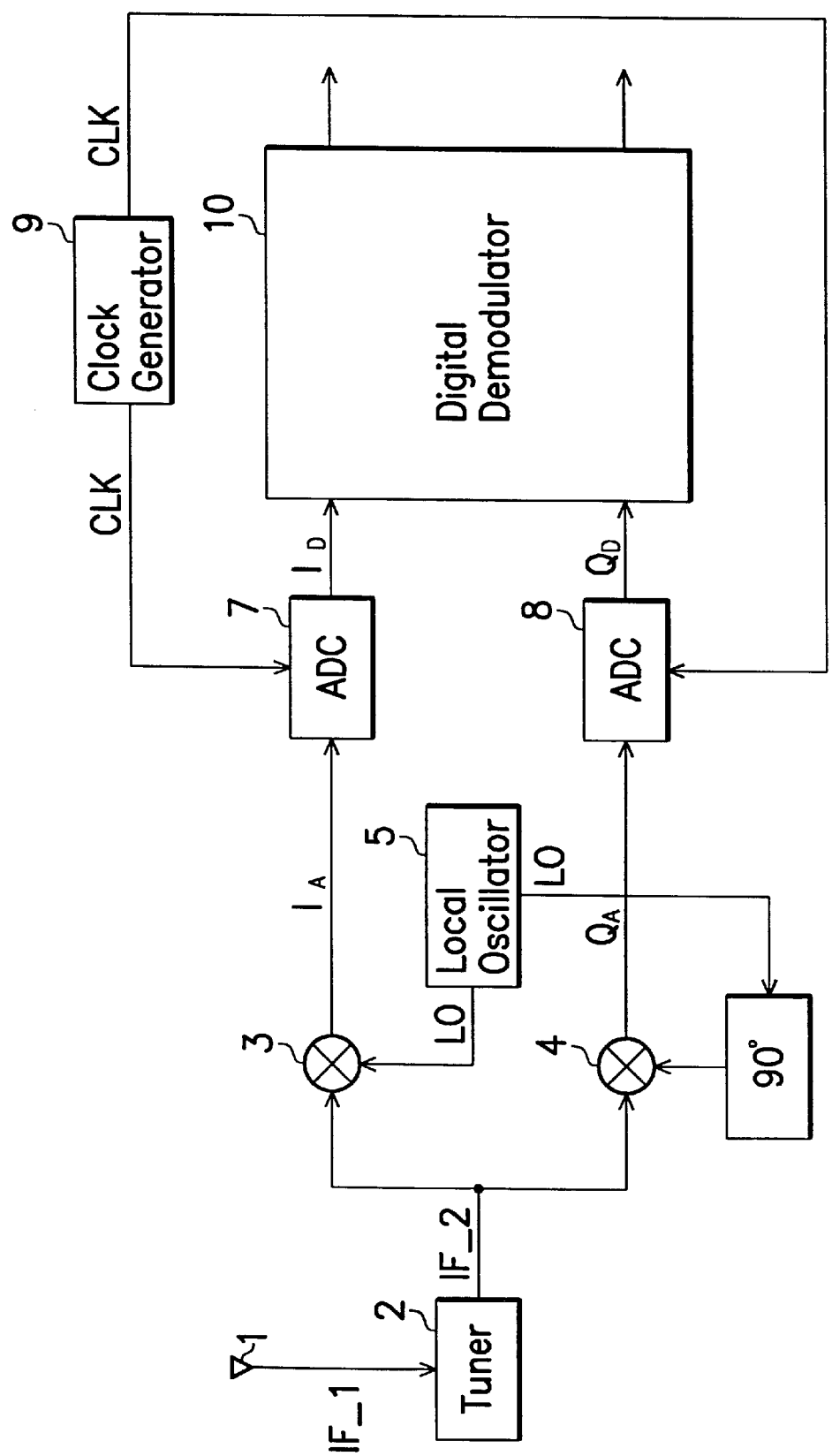
FIG. 1 schematically illustrates a block diagram of a conventional QPSK receiver.
Figure 2:
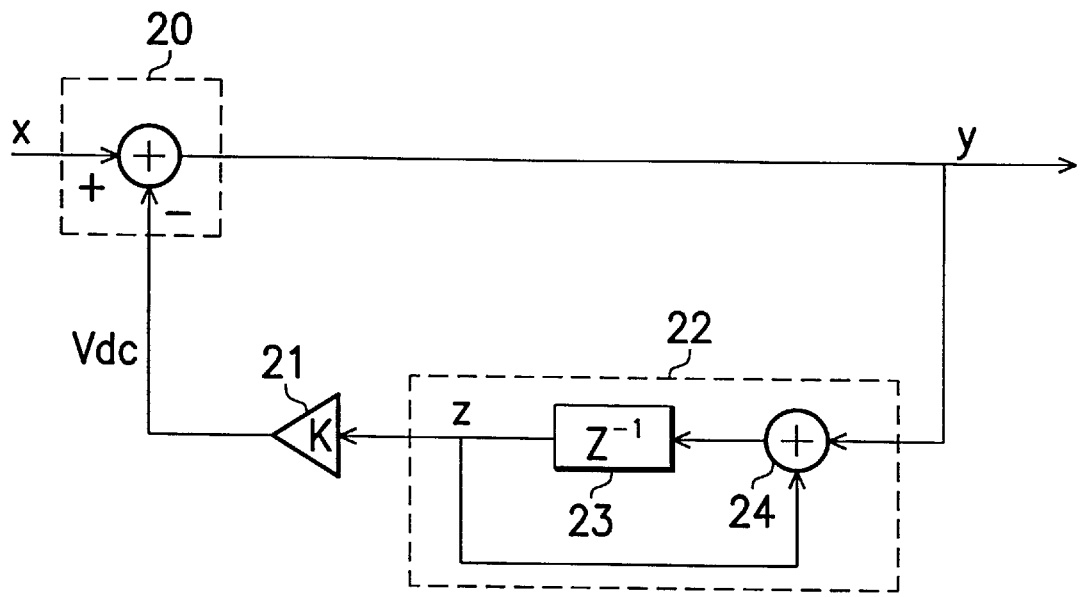
FIG. 2 schematically illustrates a block diagram of a conventional digital type circuit for DC offset cancellation.
Figure 3:
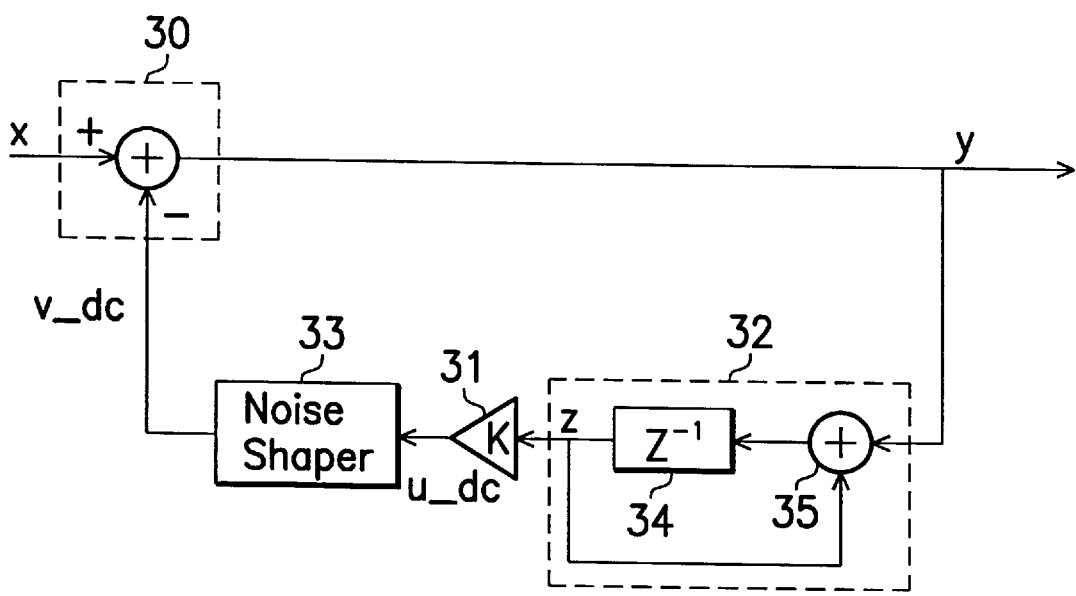
FIG. 3 schematically illustrates a block diagram of a DC offset cancellation circuit in accordance with one preferred embodiment of the present invention.

Referring to FIG. 3, a circuit diagram of a DC offset cancellation circuit in accordance with a preferred embodiment of the present invention is schematically illustrated. In FIG. 3, the DC offset cancellation circuit comprises a subtracter 30, an attenuator 31, an accumulator 32, and a noise shaper 33. Noise shaper 33 is also termed a delta-sigma modulator in literature.

As shown in FIG. 3, subtracter 30 receives the digital in-phase signal $I_D$ or the digital quadrature phase signal $Q_D$, which is designated as a digital signal x, from the associated ADC 7 or ADC 8, and subtracts a quantized DC offset v_dc from signal x so as to generate output signal y. Signal y is then fed back to accumulator 32 to generate accumulation value z, which is transmitted to attenuator 31. In FIG. 3, accumulator 32 consists of a delay 34, which is expressed in the form of a Z-transform, and an adder 35. The output of adder 35 is registered and delayed for a sampling period by delay 34, after which it is fed back to adder 35 for addition with current signal y. Attenuator 31 is used to multiply accumulation value z by constant k to generate an unquantized DC offset u_dc. Typically, the value of k is a very small negative power of 2, such as $2^{-16}$. The unquantized DC offset u_dc is then converted by noise-shaper 33 into the quantized DC offset v_dc.

To avoid increasing the required word lengths of the corrected digital in-phase signal $I_D$ and the corrected digital quadrature signal $Q_D$, the number of bits required for expressing the DC offset is reduced. Thus, according to the present invention, noise shaper 33 is utilized to convert the unquantized DC offset u_dc into the quantized DC offset $v_{dc}$. As a result of this conversion, the number of bits required for the quantized DC offset v_dc is less than that of the unquantized DC offset u_dc.

Assume that the least significant bit of ADC 7 or 8 is one. If the unquantized DC offset u_dc is ⅓ in decimal notation, that is one-third of the least significant bit of ADC 7 or 8, two integer bits and sixteen fraction bits are required to represent the unquantized DC offset u_dc as 00. 01010101 01010101 in order to effectively express the DC offset.

In the time domain, the quantized DC offset v_dc, if exemplified to possess two integer bits, is sequentially 00, 00, 01, 00, 00, 01, 00, 00, 01, . . ., etc., wherein the logic pattern of "01" represents one least significant bit of ADC 7 or 8, and the logic pattern of "00" represents zero. Therefore, the average value of the quantized DC offset v_dc approaches and is equal to the unquantized DC offset u_dc over a long time period, and thus approximates it.

Moreover, if exemplified to possess two integer bits and one fraction bit, the quantized DC offset v_dc is sequentially 00.0, 00.1, 00.1, 00.0, 00.1, 00.1, 00.0, 00,1, 00.1, . . ., etc., wherein the logic pattern of "00.1" represents half of the least significant bit of ADC 7 or 8, and the logic pattern of "00.0" represents zero. Again, the average value of the quantized DC offset v_dc is equal to the unquantized DC offset u_dc over a long time period.

Consequently, although the unquantized DC offset u_dc possesses a large number of fraction bits, the quantized DC offset v_dc can be simplified so it possesses one or zero fraction bits. For example:

$$\begin{array}{r} x\ xxxxx. \\ -\ v\_dc \quad xx.\ x \\ \hline y\ xxxxxx.\ x \end{array}$$

Figure 4:
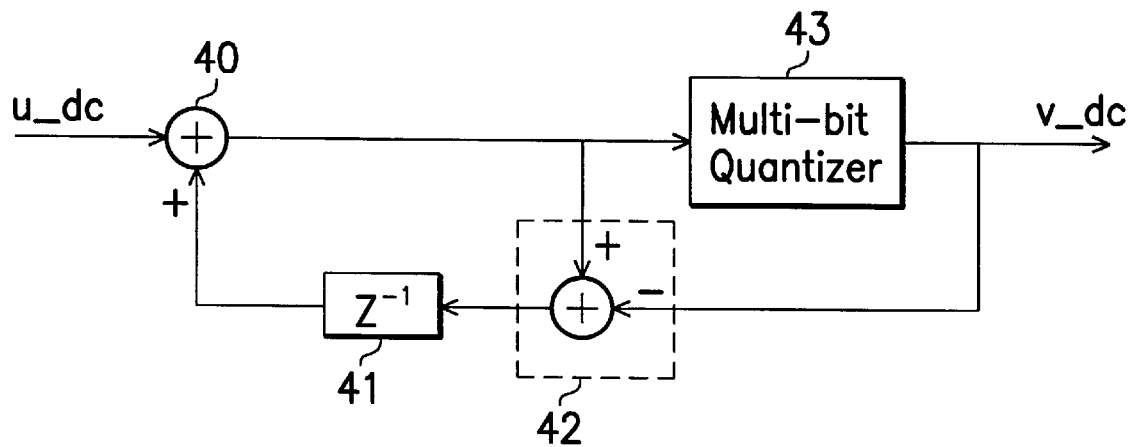
FIG. 4 schematically illustrates a block diagram of one example of a noise shaper shown in FIG. 3.

Referring to FIG. 4, a block diagram of one example of noise shaper 33, as shown in FIG. 3, is schematically illustrated. In FIG. 4, a first-order noise shaping circuit is illustrated, comprising an adder 40, a delay 41, a subtracter 42, and a multi-bit quantizer 43.

In FIG. 4, adder 40 receives the unquantized DC offset u_dc and adds it to the output of delay 41, after which the sum is transmitted to multi-bit quantizer 43 and subtracter 42. Subtracter 42 subtracts the output of multi-bit quantizer 43 from the output of adder 40 and then transmits the result to delay 41. Multi-bit quantizer 43 is employed to process the output of adder 40 to determine the quantized DC offset v_dc.

Figure 5:
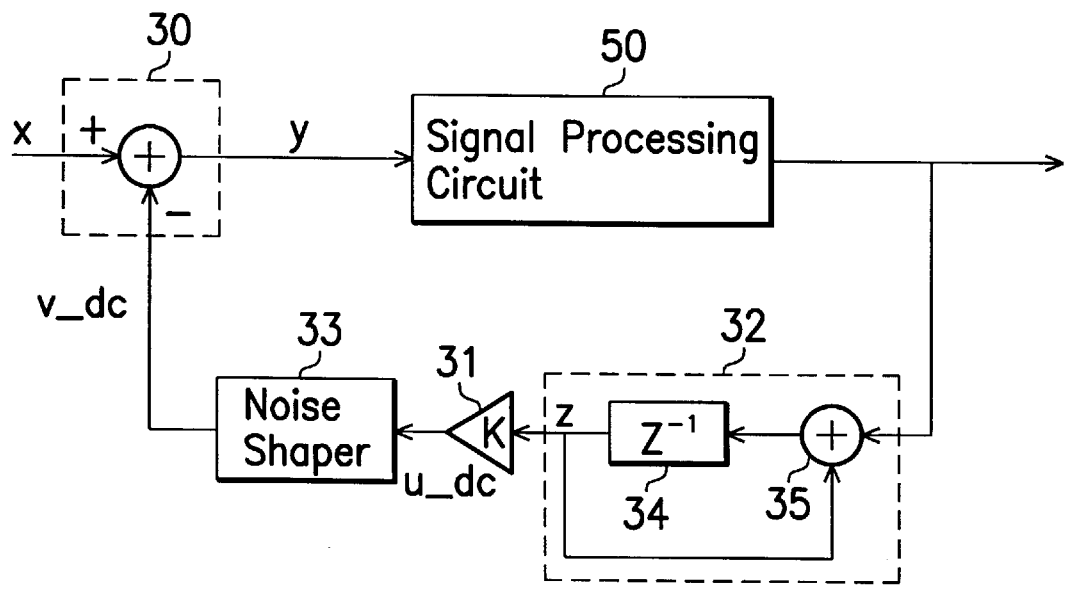
FIG. 5 schematically illustrates a block diagram of a DC offset cancellation circuit in accordance with another preferred embodiment of the present invention

Referring to FIG. 5, a circuit diagram of a DC offset cancellation circuit in accordance with another preferred embodiment of the present invention is schematically illustrated, wherein the different parts with those of the embodiment in FIG. 3 are indicated with a different numeral. In the drawing, a signal processing circuit 50 is provided to process the signal y, then transmitted to the accumulator 32. For example, the signal processing circuit 50 can be a low pass filter, a decimation filter, or a multiplier which multiplies the signal y by a gain control value.

Thus, the cancellation circuit of the preferred embodiments includes a noise shaper to convert the unquantized DC offset into a quantized DC offset having fewer bits than that of the unquantized DC offset. The use of the noise shaper reduces the required word length for QPSK signals and lessens the operational burden on the digital demodulator, thus decreasing its hardware complexity.

While the invention has been described with reference to various illustrative embodiments, the description is not intended to be construed in a limiting sense. Various modifications of the illustrative embodiments, as well as other embodiments of the invention, will be apparent to those person skilled in the art upon reference to this description. It is therefore contemplated that the appended claims will cover any such modifications or embodiments as may fall within the scope of the invention defined by the following claims and their equivalents.

What is claimed is:

1. A DC offset cancellation circuit, comprising:
   a subtracter for subtracting a quantized DC offset from a digital signal;
   a noise shaper for converting an unquantized DC offset into said quantized DC offset, said quantized DC offset having fewer bits than said unquantized DC offset and an average value in the time domain approximates said unquantized DC offset;
   an accumulator coupled to said subtracter to generate an accumulation value; and
   an attenuator for multiplying said accumulation value by a constant to generate said unquantized DC offset and transmitting said unquantized DC offset to said noise shaper, wherein said constant is less than one.

2. The DC offset cancellation circuit as claimed in claim 1, wherein said noise shaper is a first-order noise-shaping circuit.

3. The DC offset cancellation circuit as claimed in claim 2, wherein said first-order noise-shaping circuit comprises:
   a delay;
   an adder for adding said unquantized DC offset and an output of said delay;
   a quantizer for generating said quantized DC offset in response to an output of said adder; and
   another subtracter for subtracting an output of said quantizer from said adder output and transmitting an output signal to said delay.

4. The DC offset cancellation circuit as claimed in claim 1, wherein said accumulator is coupled to said subtracter by a signal processing circuit.

5. The DC offset cancellation circuit as claimed in claim 4, wherein said signal processing circuit is a low pass filter.

6. The DC offset cancellation circuit as claimed in claim 4, wherein said signal processing circuit is a decimation filter.

7. The DC offset cancellation circuit as claimed in claim 4, wherein said signal processing circuit is a multiplier.

8. A method of DC offset cancellation, comprising:
   subtracting a quantized DC offset from a digital signal by using a subtracter;
   generating an accumulation value in response to an output of said subtracter;
   multiplying said accumulation value by a constant less than one to generate an unquantized DC offset; and
   converting said unquantized DC offset to said quantized DC offset whose average value in the time domain approximates said unquantized DC offset and has fewer bits than said unquantized DC offset.

9. A DC offset cancellation circuit, comprising:
   a subtracter for subtracting a quantized DC offset from a digital signal;
   a noise shaper for converting an unquantized DC offset into said quantized DC offset, said quantized DC offset having fewer bits than said unquantized DC offset and an average value in the time domain approximates said unquantized DC offset;
   an accumulator, coupled to said subtracter by a signal processing circuit comprising a decimation filter, for generating an accumulation value; and
   an attenuator for multiplying said accumulation value by a constant to generate said unquantized DC offset and transmitting said unquantized DC offset to said noise shaper, wherein said constant is less than one.

10. The DC offset cancellation circuit as claimed in claim 9, wherein said noise shaper is a first-order noise-shaping circuit.

11. The DC offset cancellation circuit as claimed in claim 10, wherein said first-order noise-shaping circuit comprises:
    a delay;
    an adder for adding said unquantized DC offset and an output of said delay;
    a quantizer for generating said quantized DC offset in response to an output of said adder; and
    another subtracter for subtracting an output of said quantizer from said adder output and transmitting an output signal to said delay.

12. A DC offset cancellation circuit, comprising:
    a subtracter for subtracting a quantized DC offset from a digital signal;
    a noise shaper for converting an unquantized DC offset into said quantized DC offset, said quantized DC offset having fewer bits than said unquantized DC offset and an average value in the time domain approximates said unquantized DC offset;
    an accumulator, coupled to said subtracter by a signal processing circuit comprising a multiplier, for generating an accumulation value; and
    an attenuator for multiplying said accumulation value by a constant to generate said unquantized DC offset and transmitting said unquantized DC offset to said noise shaper, wherein said constant is less than one.

13. The DC offset cancellation circuit as claimed in claim 12, wherein said noise shaper is a first-order noise-shaping circuit.

14. The DC offset cancellation circuit as claimed in claim 13, wherein said first-order noise-shaping circuit comprises:
    a delay;
    an adder for adding said unquantized DC offset and an output of said delay;
    a quantizer for generating said quantized DC offset in response to an output of said adder; and
    another subtracter for subtracting an output of said quantizer from said adder output and transmitting an output signal to said delay.

* * * * *